US012684211B2

(12) United States Patent　　　　　(10) Patent No.:　　US 12,684,211 B2
Kaneda　　　　　　　　　　　　　　　(45) Date of Patent:　　　　Jul. 14, 2026

---

(54) IMAGE CAPTURING DEVICE AND HEAT DISSIPATION UNIT

(71) Applicant: Panasonic Intellectual Property Management Co., Ltd., Osaka (JP)

(72) Inventor: Norikazu Kaneda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 28 days.

(21) Appl. No.: 18/888,238

(22) Filed: Sep. 18, 2024

(65) Prior Publication Data

US 2025/0106490 A1　　Mar. 27, 2025

(30) Foreign Application Priority Data

Sep. 25, 2023　　(JP) ................................. 2023-160168

(51) Int. Cl.
*H04N 23/52*　　　(2023.01)
*H04N 23/51*　　　(2023.01)
*H04N 23/53*　　　(2023.01)
*H05K 7/20*　　　　(2006.01)

(52) U.S. Cl.
CPC ............. *H04N 23/52* (2023.01); *H04N 23/51* (2023.01); *H04N 23/531* (2023.01); *H05K 7/20418* (2013.01)

(58) Field of Classification Search
CPC ...... H04N 23/51; H04N 23/52; H04N 23/531; H04N 23/53; H05K 7/20418; H05K 7/20154; H05K 7/20409; H05K 7/20136; H05K 7/20436
See application file for complete search history.

(56) References Cited

U.S. PATENT DOCUMENTS

| | | | |
|---|---|---|---|
| 2019/0154949 A1 | 5/2019 | Hosoe et al. | |
| 2019/0385927 A1* | 12/2019 | Shibata | ................. H04N 23/52 |
| 2020/0344922 A1* | 10/2020 | Wada | ................ H05K 7/20172 |
| 2021/0321027 A1* | 10/2021 | Crow | ..................... H04N 23/52 |
| 2022/0286593 A1* | 9/2022 | Amano | ................. H04N 23/54 |
| 2023/0164408 A1* | 5/2023 | Endo | ................. H05K 7/20154 |
| | | | 348/333.06 |
| 2023/0353875 A1* | 11/2023 | Nakamura | .............. G06F 3/016 |
| 2023/0418137 A1* | 12/2023 | Watanabe | ............ H05K 7/2039 |

FOREIGN PATENT DOCUMENTS

| | | |
|---|---|---|
| JP | H09-326576 A | 12/1997 |
| JP | 2009-017050 A | 1/2009 |
| JP | 2010-072338 A | 4/2010 |
| JP | 2019-028194 A | 2/2019 |
| JP | 2019-095564 A | 6/2019 |

\* cited by examiner

*Primary Examiner* — Kelly L Jerabek
(74) *Attorney, Agent, or Firm* — Renner, Otto, Boisselle & Sklar, LLP

(57)　　　　　ABSTRACT

An image capturing device includes: a casing; a heat source provided inside the casing; a monitor; a hinge provided to the casing and rotatably supporting the monitor; and a heat dissipation unit including a plurality of fins provided on an outer surface of the casing and thermally connected to the heat source. The monitor is configured to be rotatable by the hinge between a first position at which the monitor covers the plurality of fins of the heat dissipation unit, and a second position at which the monitor is away from the plurality of fins.

10 Claims, 9 Drawing Sheets

IMAGE CAPTURING DEVICE AND HEAT DISSIPATION UNIT

BACKGROUND

Technical Field

The present disclosure relates to an image capturing device and a heat dissipation unit included in an image capturing device.

Description of the Related Art

As one example, JP 2009-017050 A discloses an image capturing device including a cooling unit attached detachably to the bottom surface of a casing, and configured to cool the casing actively. By allowing the cooling unit to be attached or detached from the casing selectively, it is possible to cool the image capturing device as required.

SUMMARY

However, in the image capturing device described in JP 2009-017050 A, when the cooling unit is attached to the bottom surface of the casing, a tripod or the like cannot be attached to the bottom surface of the casing. In addition, the image capturing device cannot be placed on a desk or the like, via the bottom surface. In other words, the cooling unit is attached to the casing at the expense of some functions.

Therefore, an object of the present disclosure is to achieve a heat dissipation unit for an image capturing device, the heat dissipation unit being provided on an outer surface of a casing of the image capturing device, and configured to cool the image capturing device as required without sacrificing other functions.

In order to solve the above problem, according to an aspect of the present disclosure, an image capturing device is provided that includes:

a casing;

a heat source provided inside the casing;

a monitor;

a hinge provided to the casing and rotatably supporting the monitor; and a heat dissipation unit that includes a plurality of fins provided on an outer surface of the casing and is thermally connected to the heat source, wherein the monitor is configured rotatable, by the hinge, between a first position at which the monitor covers the plurality of fins of the heat dissipation unit, and a second position at which the monitor is away from the plurality of fins.

Also, according to another aspect of the present disclosure, a heat dissipation unit detachably attached to an image capturing device is provided that, the image capturing device includes:

a casing;

a heat source provided inside the casing;

a monitor; and a hinge provided to the casing and rotatably supporting the monitor, the casing includes a monitor seating surface allowing the monitor to be seated, and the heat dissipation unit is detachably attached to the monitor seating surface, and is thermally connected to the heat source.

According to the present disclosure, it is possible to achieve a heat dissipation unit for an image capturing device, the heat dissipation unit being provided on an outer surface of a casing of the image capturing device, and configured to cool the image capturing device as required without sacrificing other functions.

DETAILED DESCRIPTION

An embodiment will now be explained in detail, with reference to drawings as appropriate. However, descriptions more in detail than necessary may be omitted. For example, detailed descriptions of well-known matters and redundant descriptions of substantially the same configurations may be omitted. This is to avoid unnecessary redundancy of the description below, and to facilitate understanding of those skilled in the art.

Note that the inventor(s) provide the accompanying drawings and the following description to facilitate those skilled in the art to fully understand the present disclosure, and the accompanying drawings and the following description are not intended to limit the subject matter defined in the claims in any way.

An image capturing device according to the embodiment of the present disclosure will now be explained with reference to some drawings.

Figure 1:
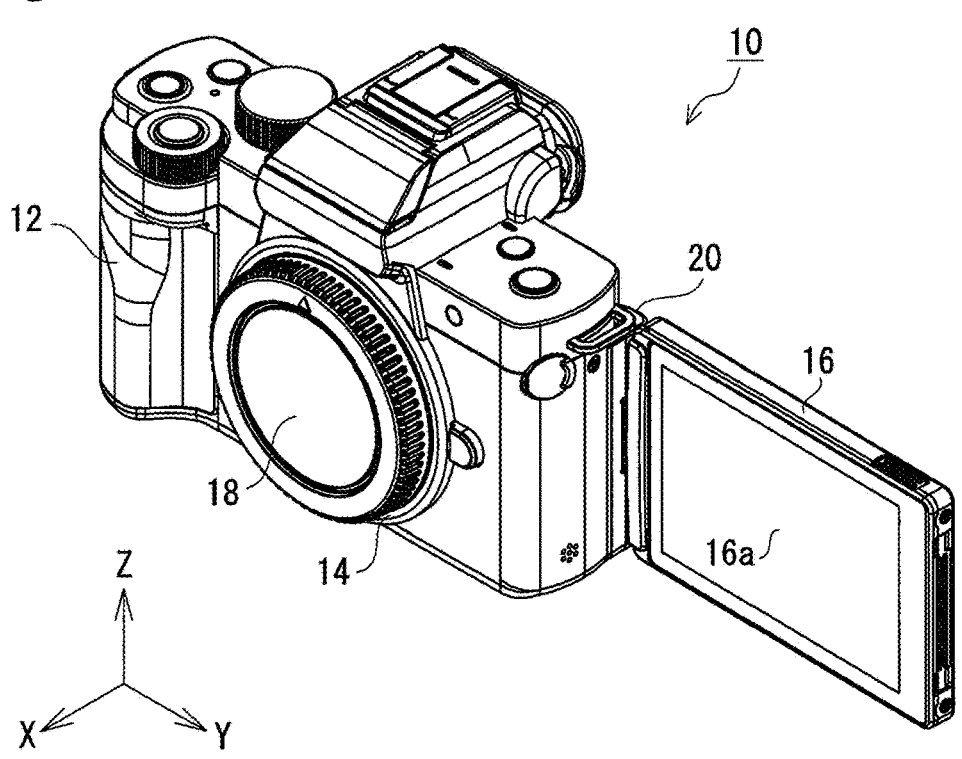
FIG. 1 is a perspective view of an image capturing device according to one embodiment of the present disclosure.
Figure 2:
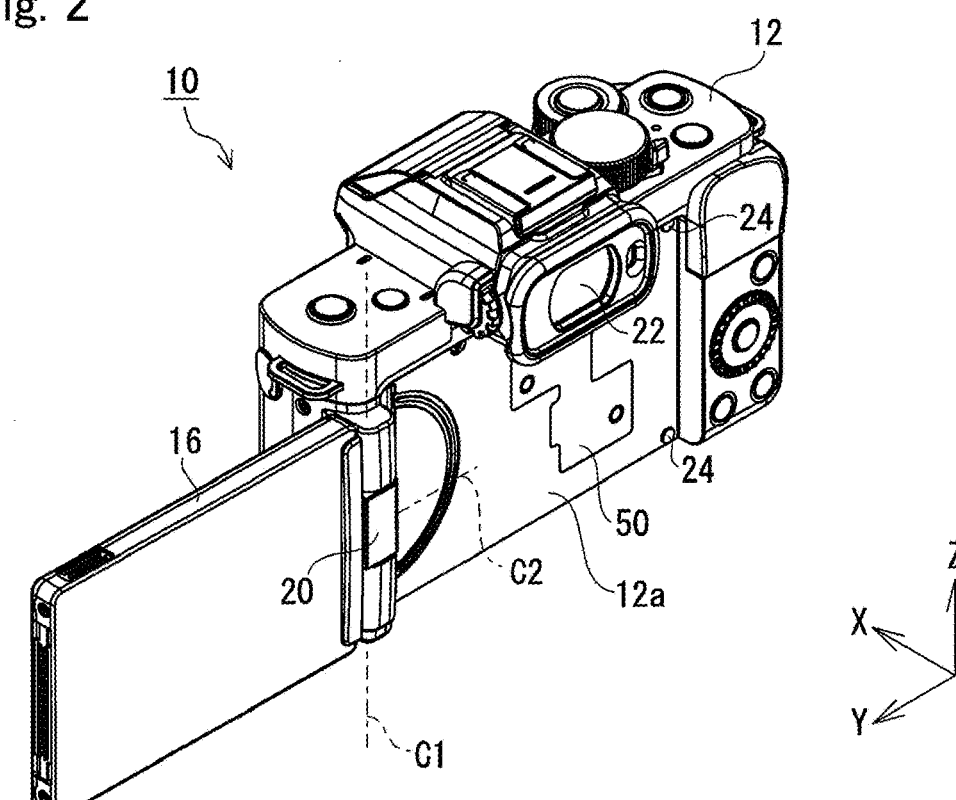
FIG. 2 is a rear perspective view of the image capturing device.

FIG. 1 is a perspective view of the image capturing device according to the embodiment of the present disclosure. FIG. 2 is a rear perspective view of the image capturing device. Note that the X-Y-Z Cartesian coordinate system indicated in the drawings is for the purpose of facilitating the understanding of the embodiment according to the present disclosure, and is not intended to limit the scope of the embodiment according to the present disclosure in any way. The X-axis direction corresponds to a front-back direction of the image capturing device; the Y-axis direction corresponds to a left-right direction; and the Z-axis direction corresponds to a height direction. Furthermore, in the description herein, the side of a subject an image of which is to be captured by the image capturing device will be referred to as a "front side", and the side of the image capturing device will be referred to as "rear side".

As illustrated in FIGS. 1 and 2, this image capturing device 10 according to the present exemplary embodiment includes a casing 12, a lens mount 14 provided to the front surface of the casing 12 and having a lens (not illustrated) attached detachably, and a monitor 16 provided on the rear surface of the casing 12. Note that the image capturing device 10 illustrated in FIG. 1 has a lens cover 18 attached to the lens mount 14.

As illustrated in FIG. 1, the monitor 16 is a liquid crystal display, for example, and includes a display unit 16a on which an image and the like are displayed. The monitor 16 is mounted on the casing 12 via a hinge 20 provided to the casing 12. In the configuration according to the present exemplary embodiment, the hinge 20 supports the monitor 16 in a manner rotatable about a first rotational axis C1 extending in the height direction (Z-axis direction) and a second rotational axis C2 extending in a direction orthogonal to the first rotational axis C1. That is, the monitor 16 is a vari-angle monitor. With the hinge 20, the display unit 16a of the monitor 16 can be directed to various directions.

The monitor 16 is enabled to display an image of a subject, the image having passed through a lens attached to the lens mount 14 of the image capturing device 10. Specifically, an imaging element (not illustrated) is disposed inside the image capturing device 10, at a position behind the lens attached to the lens mount 14. The imaging element receives an image of the subject through the lens attached to the lens mount 14, and converts the received image into image data. The image data is then displayed on the monitor 16. Note that the image data is also displayed on an electronic viewfinder 22.

FIGS. 1 and 2 illustrate the image capturing device 10 in what is called a selfie mode. The selfie mode is a mode in which a user in front of the image capturing device 10 captures an image of the user himself/herself, while checking the image of the user himself/herself on the monitor 16. In the selfie mode, the monitor 16 is on the right side of the image capturing device 10, and the display unit 16a faces the front side. Note that, in the selfie mode, the image capturing device 10 may be mounted on a tripod or the like at a predetermined position, and operated by the user remotely from a position away from the image capturing device 10.

When the user keeps capturing images for a long time, the casing 12 of the image capturing device 10 becomes heated. For example, when a high-resolution video is kept being captured for a long time, a heat source such as a memory, an imaging element, or a processor generates heat inside the casing 12. In particular, a processor such as an MPU that processes the video generates high-temperature heat. The image capturing device 10 according to the present exemplary embodiment has high cooling performance so as to enable a user to keep capturing such a high-resolution video for a long time.

Figures 3, 4:
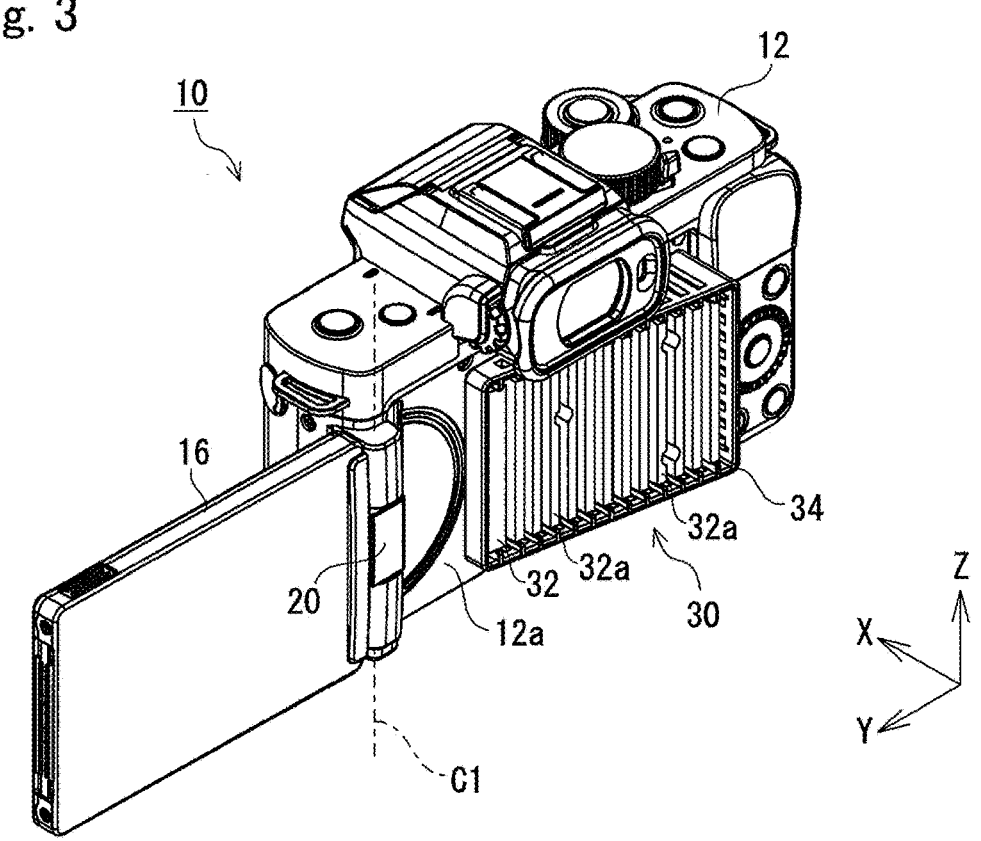
FIG. 3 is a rear perspective view of the image capturing device with a heat dissipation unit attached.
FIG. 4 is a rear view of the image capturing device with the heat dissipation unit attached.
Figure 5:
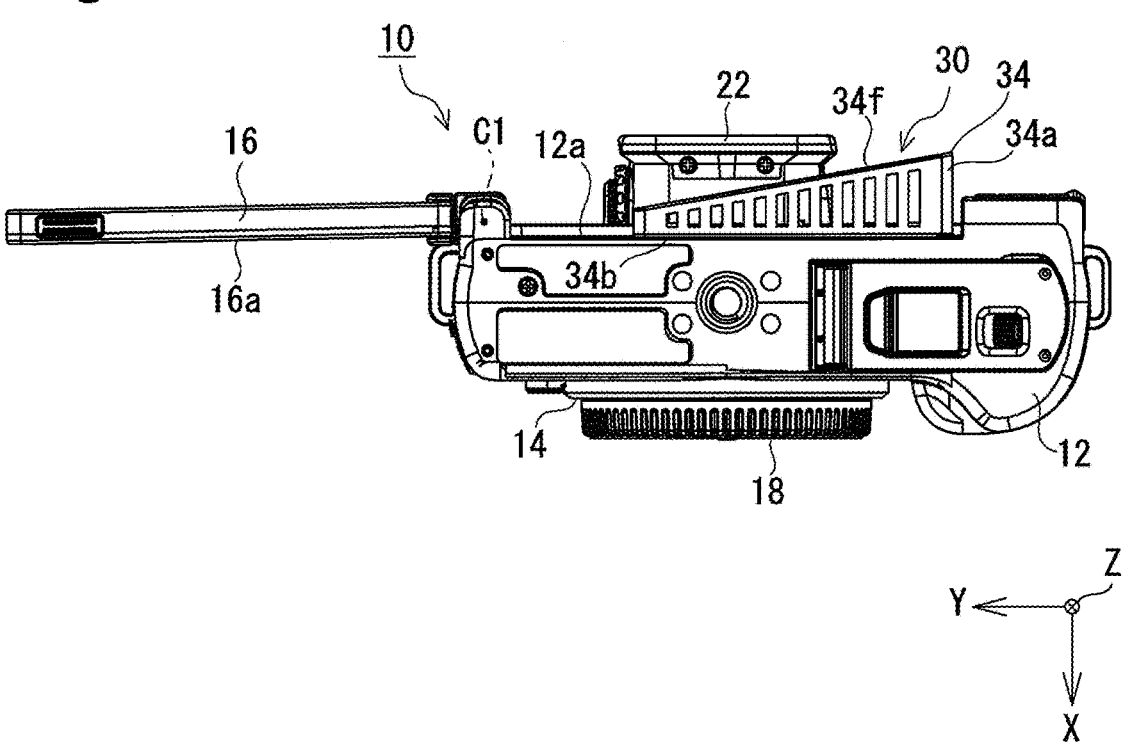
FIG. 5 is a bottom view of the image capturing device with the heat dissipation unit attached.
Figure 6:
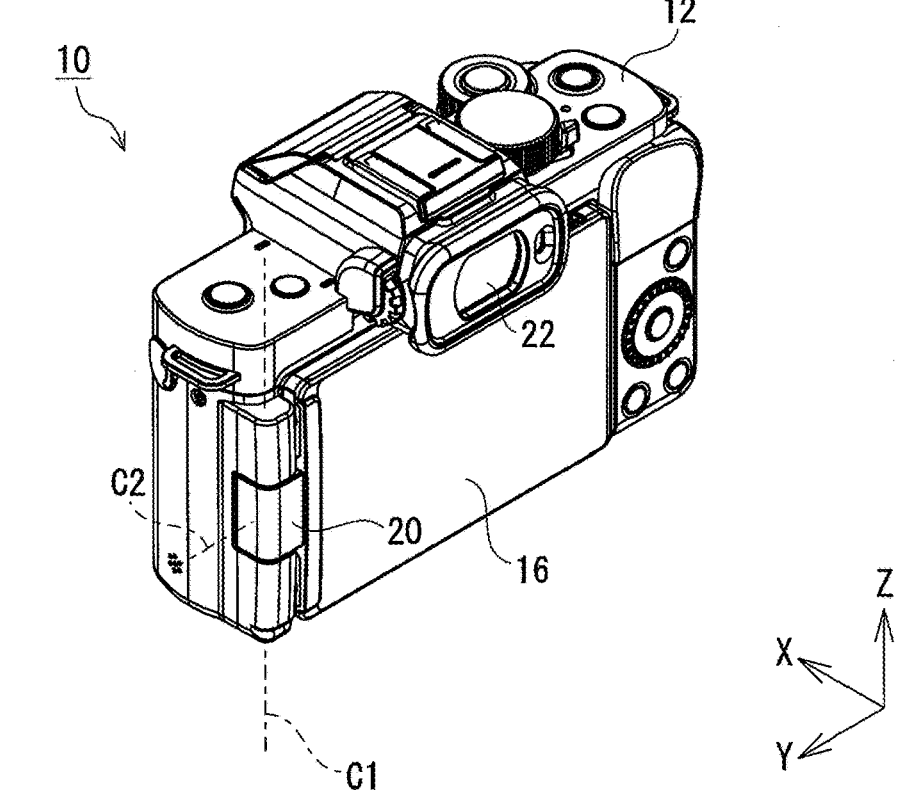
FIG. 6 is a perspective view of the image capturing device with a monitor seated on the casing.
Figure 7:
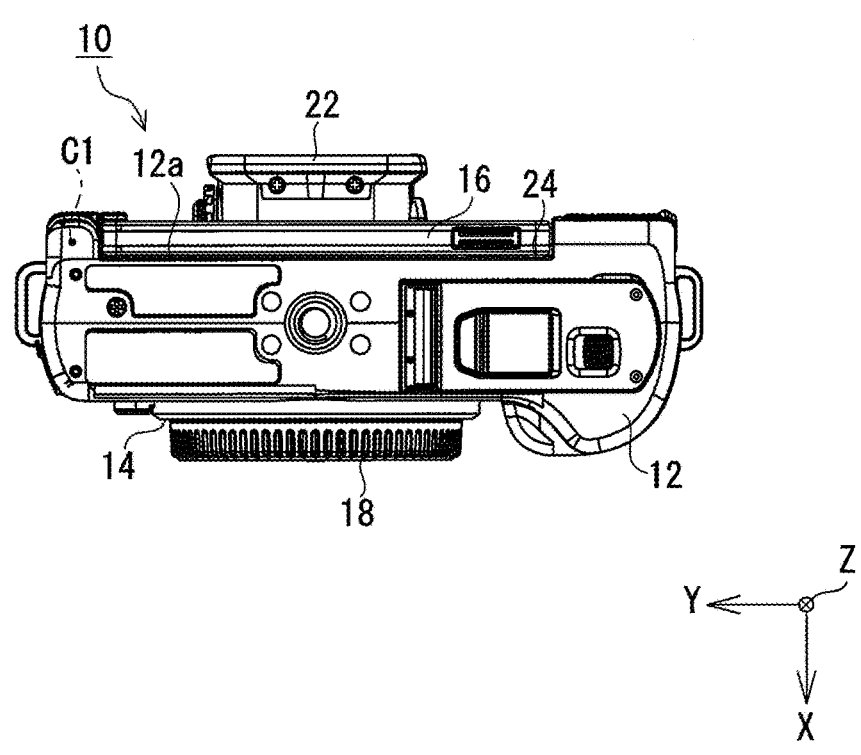
FIG. 7 is a bottom view of the image capturing device with the monitor seated on the casing.

FIG. 3 is a rear perspective view of the image capturing device with a heat dissipation unit attached. FIG. 4 is a rear view of the image capturing device with the heat dissipation unit attached. FIG. 5 is a bottom view of the image capturing device with the heat dissipation unit attached. FIG. 6 is a rear perspective view of the image capturing device with the monitor seated on the casing. FIG. 7 is a bottom view of the image capturing device with the monitor seated on the casing.

In order to achieve high cooling performance, the image capturing device 10 according to the present exemplary embodiment includes a heat dissipation unit 30, as illustrated in FIGS. 3 to 5. The heat dissipation unit 30 is a unit for cooling the internal of the casing 12 by releasing the heat inside the casing 12 of the image capturing device 10 to the outside of the casing 12.

As illustrated in FIGS. 3 to 5, the heat dissipation unit 30 is provided on the outer surface of the casing 12 during the use. In the example according to this embodiment, the heat dissipation unit 30 is detachably attached to a monitor seating surface 12a of the casing 12 where the monitor 16 is seated. As illustrated in FIGS. 6 and 7, the monitor seating surface 12a is a part of the rear surface of the casing 12, the part being a part that faces the monitor 16 when the monitor 16 is at a position closest to the rear surface of the casing 12 in a state where the heat dissipation unit 30 is not attached. Strictly speaking, in this embodiment, the monitor 16 is not in direct contact with the monitor seating surface 12a. As illustrated in FIG. 4, cushion pads 24 are provided on the monitor seating surface 12a, and the monitor 16 comes into contact with the cushion pads 24. FIG. 6 illustrates the monitor 16 being seated on the monitor seating surface 12a of the casing 12, with the display unit 16a of the monitor 16 facing the front side, that is, facing the casing 12. It is also possible for the monitor 16 to be seated on the monitor seating surface 12a with the display unit 16a facing the rear side.

While the monitor 16 is not seated on the monitor seating surface 12a, the heat dissipation unit 30 is provided on the monitor seating surface 12a of the casing 12, as illustrated in FIGS. 3 to 5. In other words, the heat dissipation unit 30 can be attached to the monitor seating surface 12a while the monitor 16 is separated from the monitor seating surface 12a, as illustrated in FIG. 2.

Figure 8:
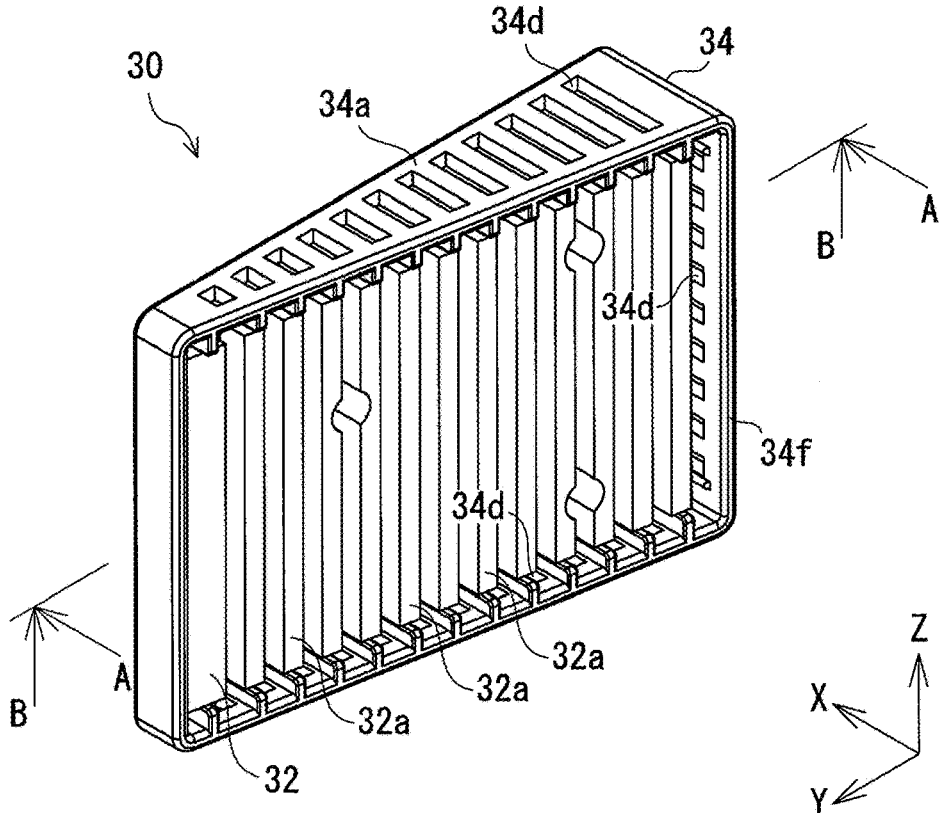
FIG. 8 is a rear perspective view of the heat dissipation unit.
Figure 9:
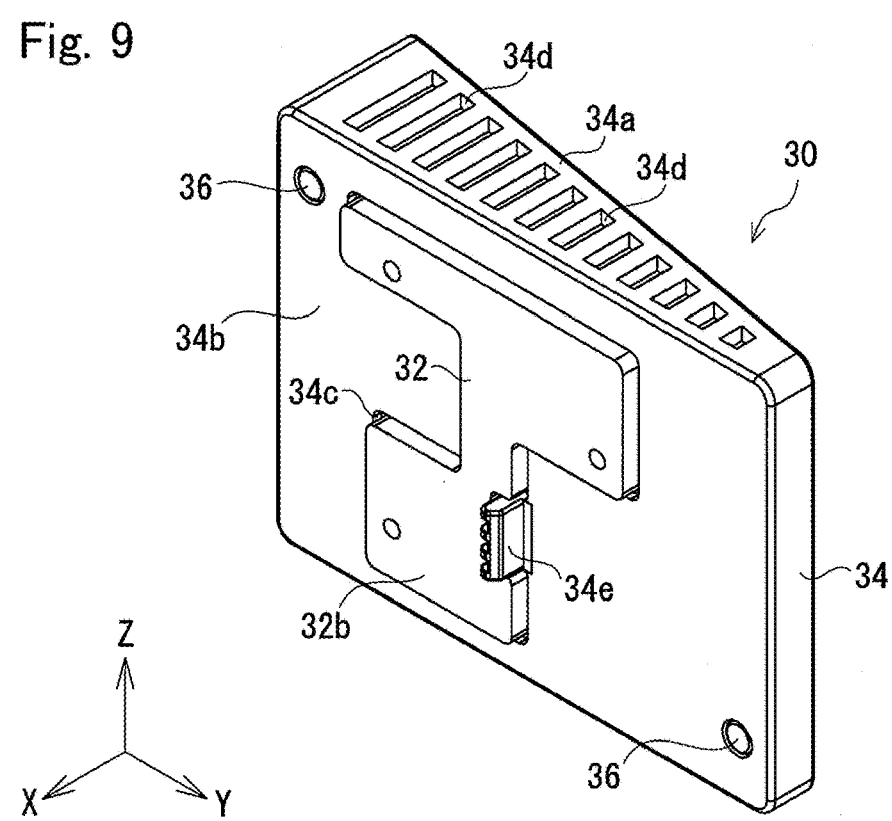
FIG. 9 is a front perspective view of the heat dissipation unit.
Figure 10:
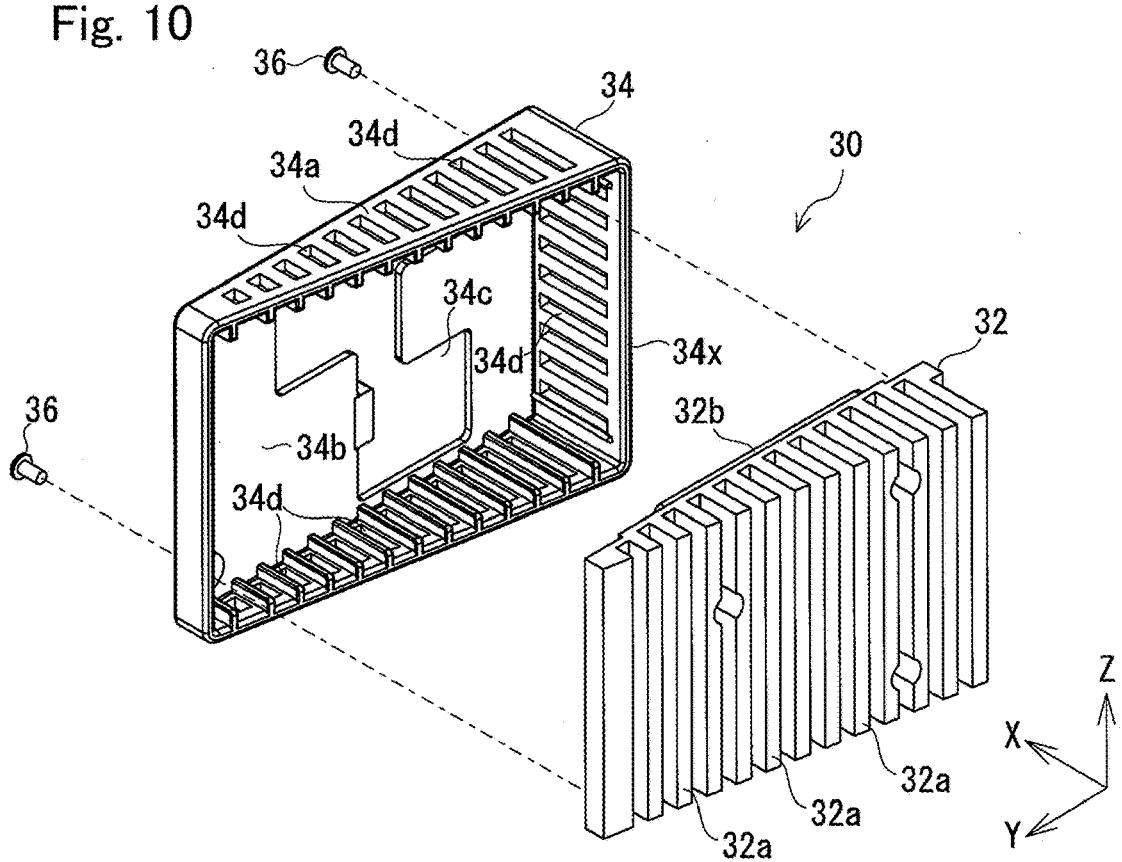
FIG. 10 is an exploded perspective view of the heat dissipation unit.
Figures 11, 12:
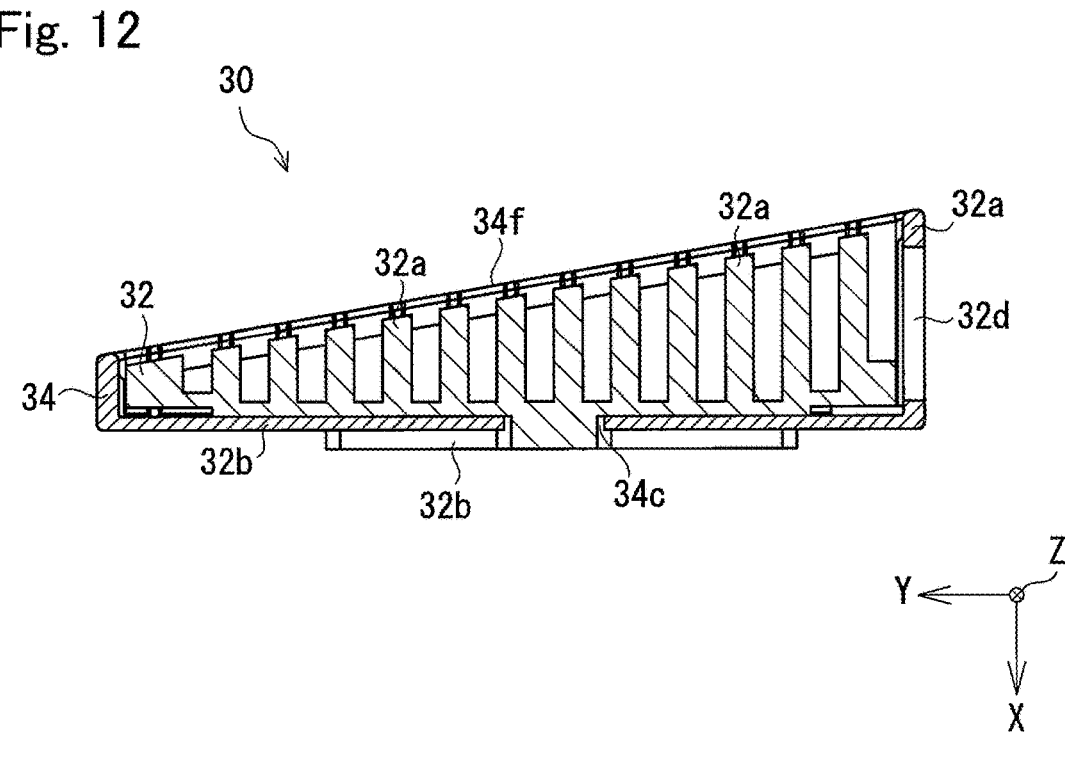
FIG. 11 is a cross-sectional view of the heat dissipation unit taken along line A-A in FIG. 8.
FIG. 12 is a cross-sectional view of the heat dissipation unit taken along line B-B in FIG. 8.

FIG. 8 is a rear perspective view of the heat dissipation unit. FIG. 9 is a front perspective view of the heat dissipation unit. FIG. 10 is an exploded perspective view of the heat dissipation unit. FIG. 11 is a cross-sectional view of the heat dissipation unit taken along line A-A in FIG. 8. FIG. 12 is a cross-sectional view of the heat dissipation unit taken along line B-B in FIG. 8.

As illustrated in FIGS. 8 to 12, in the example according to this embodiment, the heat dissipation unit 30 includes a heat sink 32 and a heat sink cover 34 that partially covers the heat sink 32.

The heat sink 32 is a member made of a material having high thermal conductivity, e.g., an aluminum alloy. The heat sink 32 includes a plurality of fins 32a arranged at intervals. As illustrated in FIGS. 3 and 4, when the heat dissipation unit 30 is attached to the casing 12 of the image capturing device 10, each of the plurality of fins 32a of the heat sink 32 protrudes in the front-rear direction (X-axis direction) of the image capturing device 10, and is arranged along the left-right direction (Y-axis direction) at an interval. That is, the plurality of fins 32*a* protrudes in a direction intersecting with the monitor seating surface 12*a*, and are arranged at intervals in a direction (Y-axis direction) that is orthogonal to the direction in which a first rotational axis C1 of the monitor 16 extends (Z-axis direction).

In addition, as illustrated in FIG. 9, the heat sink 32 includes a connector 32*b* to be thermally connected to a heat source inside the casing 12, to described later.

As illustrated in FIG. 10, the heat sink cover 34 is a member that is made of a resin material, for example, and partially covers the heat sink 32. In the example according to this embodiment, the heat sink cover 34 is a box that houses the heat sink 32. Specifically, the heat sink cover 34 includes a wall 34*a* erect in a protruding direction (X-axis direction) in which the plurality of fins 32*a* protrudes, and surrounding the plurality of fins 32*a* at least partially, in a view in the protruding direction, and a bottom 34*b* supporting the heat sink 32. In the example according to this embodiment, the heat sink 32 is fixed to the bottom 34*b* of the heat sink cover 34, with a plurality of fixing screws 36. In the example according to this embodiment, the wall 34*a* has a rectangular ring-like shape in a view along the direction in which the fins 32*a* protrude. However, the wall 34*a* is not limited to the ring-like shape, and may have another shape such as a "U" shape.

When the heat dissipation unit 30 is attached to the casing 12 of the image capturing device 10, the bottom 34*b* of the heat sink cover 34 is seated on (comes into contact with) the monitor seating surface 12*a*. At this time, the ring-like wall 34*a* is erect in a direction (X-axis direction) intersecting with the monitor seating surface 12*a*.

In the example according to this embodiment, as illustrated in FIGS. 9 and 10, a through hole 34*c* through which the connector 32*b* of the heat sink 32 is passed is provided to the bottom 34*b* of the heat sink cover 34. Furthermore, in the example according to this embodiment, as illustrated in FIGS. 11 and 12, the ring-like wall 34*a* of the heat sink cover 34 is provided with a plurality of ventilation holes 34*d* each having a through-hole-like shape, so as to ensure air flows in the space between the plurality of fins 32*a* of the heat sink 32.

Figure 13:
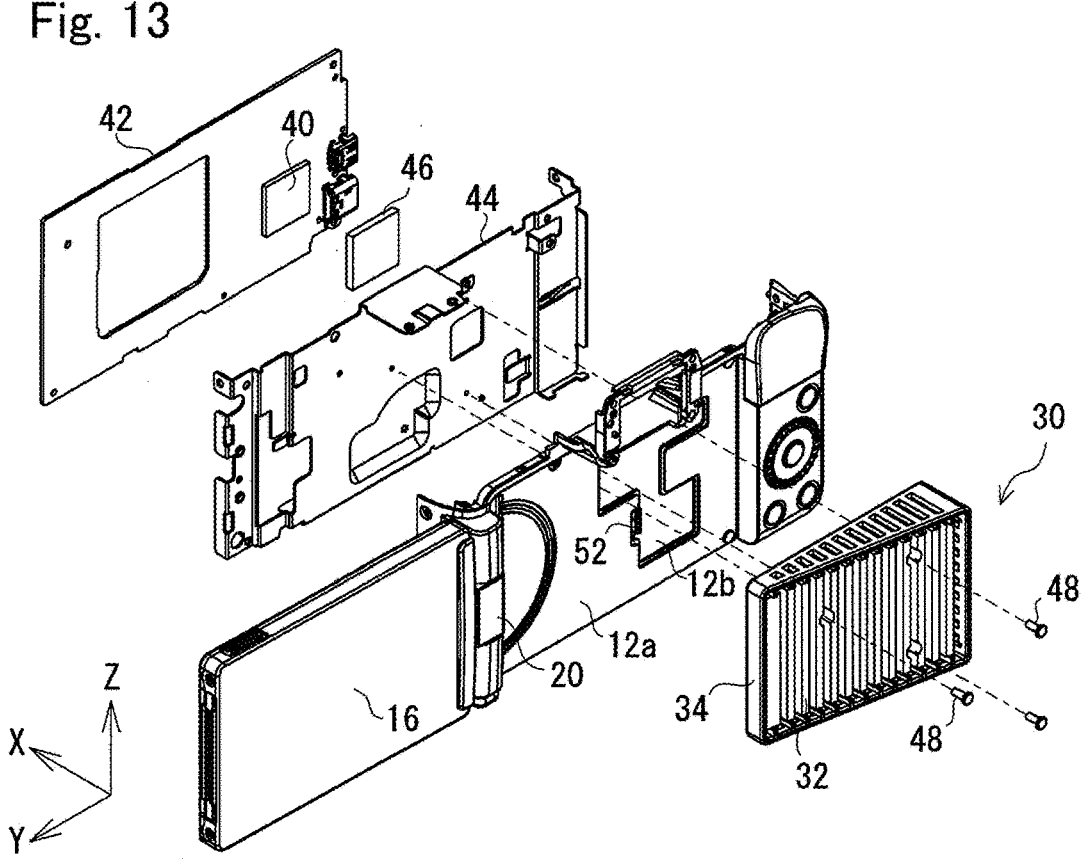
FIG. 13 is an exploded perspective view of a part of the image capturing device, illustrating a thermal connection between a heat source and the heat dissipation unit in the casing.
Figure 14:
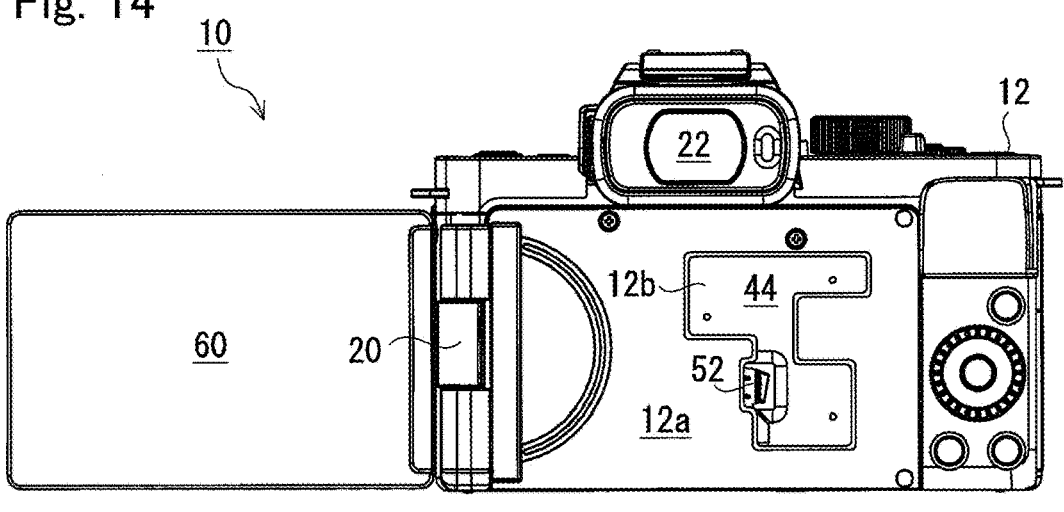
FIG. 14 is a rear view of the image capturing device, illustrating a monitor seating surface with the heat dissipation unit removed.
Figure 14:
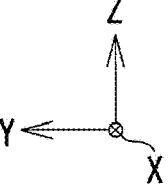

FIG. 13 is an exploded perspective view of a part of the image capturing device, illustrating thermal connection between a heat source and the heat dissipation unit in the casing. FIG. 14 is a rear view of the image capturing device, illustrating the monitor seating surface, with the heat dissipation unit removed. A part of the casing of the image capturing device is omitted in FIG. 13.

As illustrated in FIG. 13, in the example according to this embodiment, a processor 40 for executing video processing is provided inside the casing 12, as a heat source that is thermally connected to the heat dissipation unit 30 (the connector 32*b* of the heat sink 32). The processor 40 is mounted on a circuit board 42 provided inside the casing 12.

In the example according to this embodiment, a heat transfer member 44 made of a metal and having a high thermal conductivity is provided between the circuit board 42 and the casing 12, and the heat dissipation unit 30 is thermally connected to the processor 40 via the heat transfer member 44. Note that the processor 40 is in contact with the heat transfer member 44 via a heat conducting cushion 46 having a high thermal conductivity.

Furthermore, in the example according to this embodiment, the heat dissipation unit 30 is fixed to the heat transfer member 44 via a plurality of attachment screws 48, with the connector 32*b* of the heat sink 32 in direct contact with the heat transfer member 44. In order to bring the connector 32*b* of the heat sink 32 into direct contact with the heat transfer member 44 that is inside the casing 12, the monitor seating surface 12*a* of the casing 12 is provided with a through hole 12*b* through which the connector 32*b* is passed. As illustrated in FIG. 14, a part of the heat transfer member 44 inside the casing 12 is exposed through the through hole 12*b*. As a result, when the bottom 34*b* of the heat sink cover 34 of the heat dissipation unit 30 is seated on the monitor seating surface 12*a*, the connector 32*b* of the heat sink 32 is passed through the through hole 12*b*, and comes into contact with the heat transfer member 44 that is inside the casing 12.

When the processor 40 becomes highly heated due to shooting of a high-resolution movie over an extended time, for example, the heat of the processor 40 is transferred to the heat transfer member 44 via the heat conducting cushion 46. The heat of the heat transfer member 44 is then transferred to the plurality of fins 32*a* via the connector 32*b* of the heat sink 32 included in the heat dissipation unit 30. The heat is then released from the surfaces of the plurality of fins 32*a* to the outside air. As a result, the processor 40 becomes cooled.

The heat source cooled by the heat dissipation unit 30 is not limited to the processor 40. By thermally connecting the other heat sources to the heat transfer member 44, the heat dissipation unit 30 is enabled to cool the other heat sources.

Figure 15:
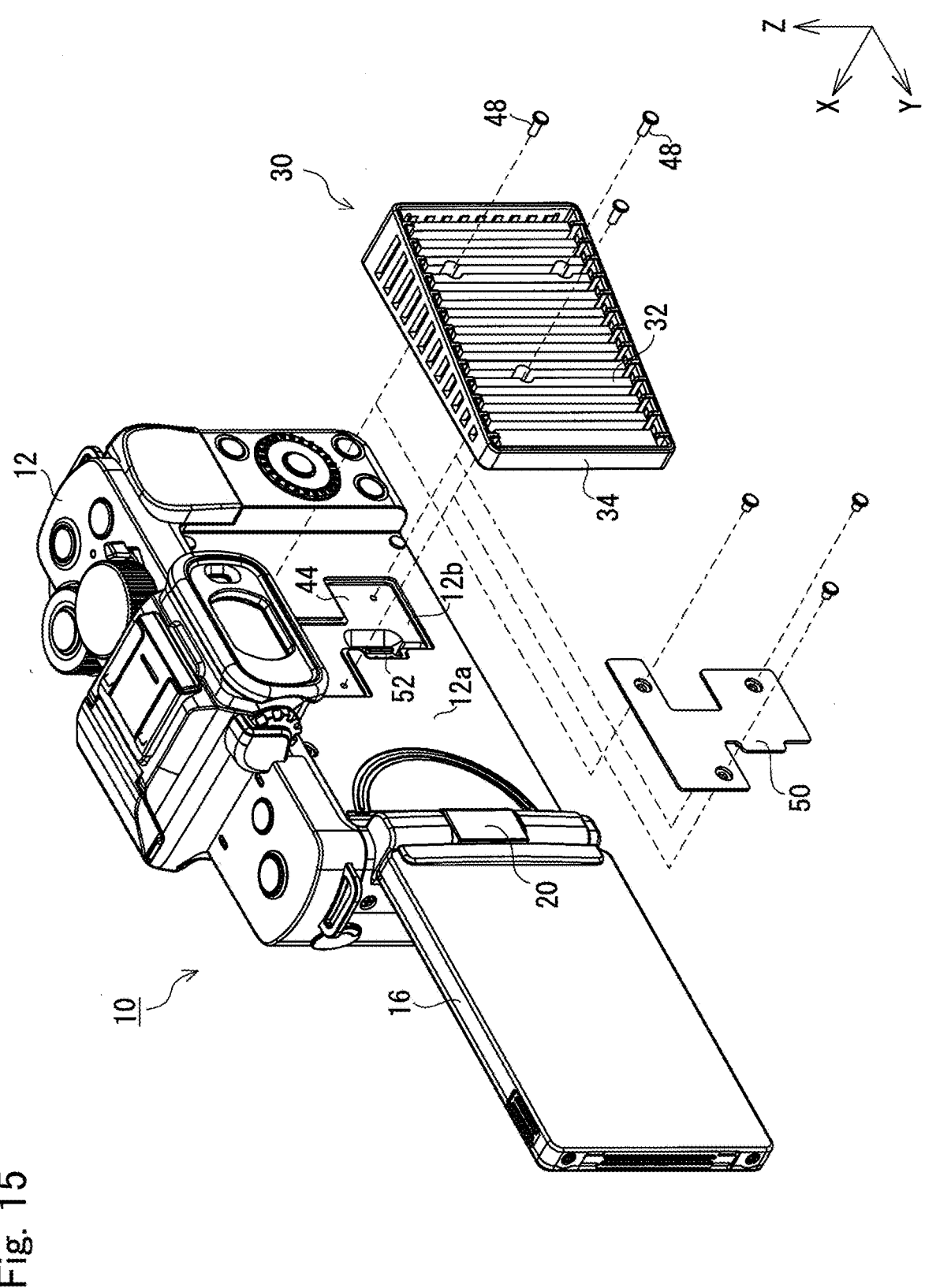
FIG. 15 is a rear perspective view of the image capturing device, illustrating how the heat dissipation unit and a lid member are attached and detached.

FIG. 15 is a rear perspective view of the image capturing device, illustrating how the heat dissipation unit and a lid member are attached and detached.

As illustrated in FIG. 15, by removing the plurality of attachment screws 48 from the heat transfer member 44, heat dissipation unit 30 becomes separated from casing 12. Even after the heat dissipation unit 30 is separated, the inside and the outside of the casing 12 remain connected via the through hole 12*b*, so that foreign substances may be get inside the casing 12. As a countermeasure for this issue, a lid member 50 for closing the through hole 12*b* is attached to the through hole 12*b*, as illustrated in FIG. 2. In a state where the lid member 50 is attached to the through hole 12*b*, the monitor 16 is allowed to be seated on the monitor seating surface 12*a*. In other words, heat dissipation unit 30 and the lid member 50 can be attached selectively to the casing 12. Therefore, when cooling with the heat dissipation unit 30 is not necessary for an extended time period, e.g., while the image capturing device 10 is stored over a long time period, or while only still images are kept being captured without capturing any moving image, it is possible to seat the monitor 16 on the monitor seating surface 12*a* to make the image capturing device 10 compact.

Because the heat dissipation unit 30 is detachable from the casing 12, it is also possible for a user to make an operation that requires cooling by the heat dissipation unit 30, e.g., shooting of a high-resolution video over an extended time period, with the heat dissipation unit 30 separated from the casing 12. As a countermeasure for this problem, in the example according to this embodiment, as illustrated in FIGS. 13 to 15, the image capturing device 10 includes a heat dissipation unit detection sensor 52 for detecting that the heat dissipation unit 30 is attached to the casing 12. In the example according to this embodiment, the heat dissipation unit detection sensor 52 is a mechanical switch. As illustrated in FIG. 9, the heat dissipation unit detection sensor 52 detects that the bottom 34*b* of the heat sink cover 34 of the heat dissipation unit 30 is seated on the monitor seating surface 12*a* by coming into contact with a protrusion 34*e* provided on the heat sink cover 34 of the heat dissipation unit 30. With this, when the user performs an operation related to the operation requiring the heat dissipation unit 30 while the heat dissipation unit 30 is separated from the casing 12, it is possible to give a warning to the user. For example, it is possible to give the user an instruction to attach the heat dissipation unit 30 to the casing 12, on the monitor 16.

As illustrated in FIGS. 3 to 5, in a state where the heat dissipation unit 30 is attached to the monitor seating surface 12a of the casing 12, it is not possible to seat the monitor 16 on the monitor seating surface 12a. Therefore, the monitor 16 remains freely rotatable, and may hit hard against the heat dissipation unit 30. For example, when the user suddenly moves the image capturing device 10, the monitor 16 may suddenly rotate and collide with the heat dissipation unit 30, giving a large impact thereto.

Figure 16:
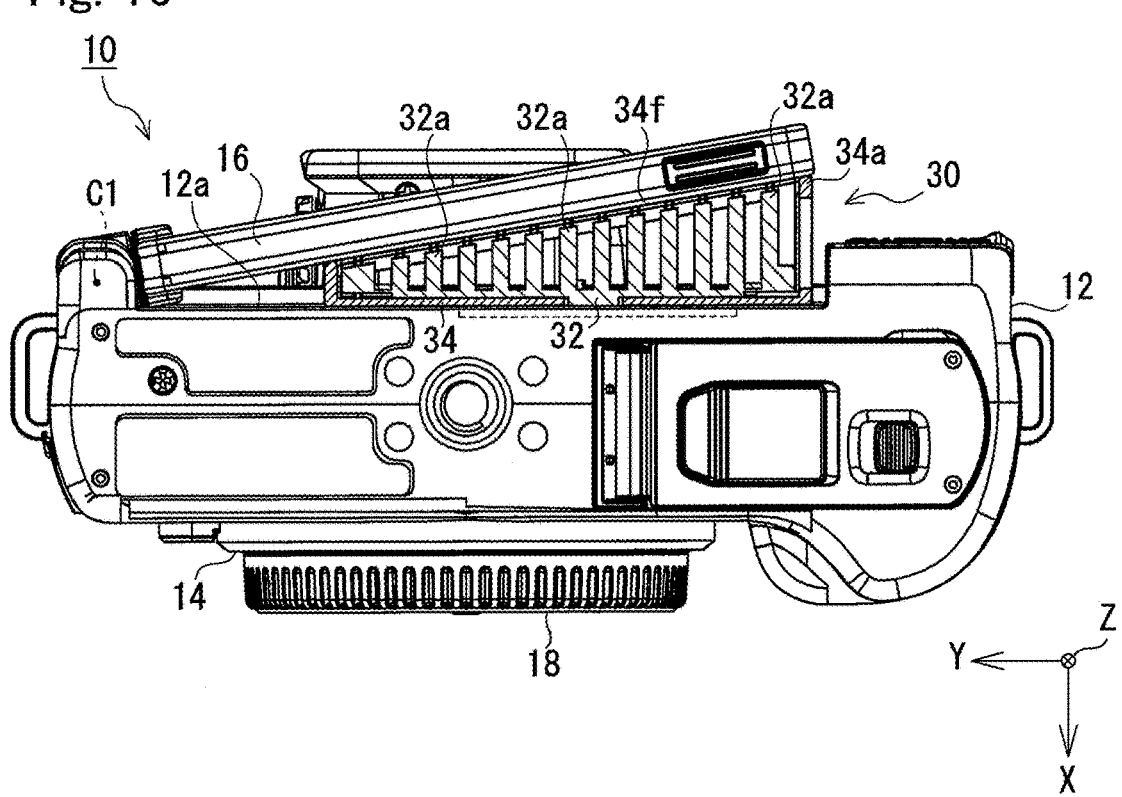
FIG. 16 is a partial cross-sectional view of the image capturing device, with the monitor seated on the heat dissipation unit.
Figure 17:
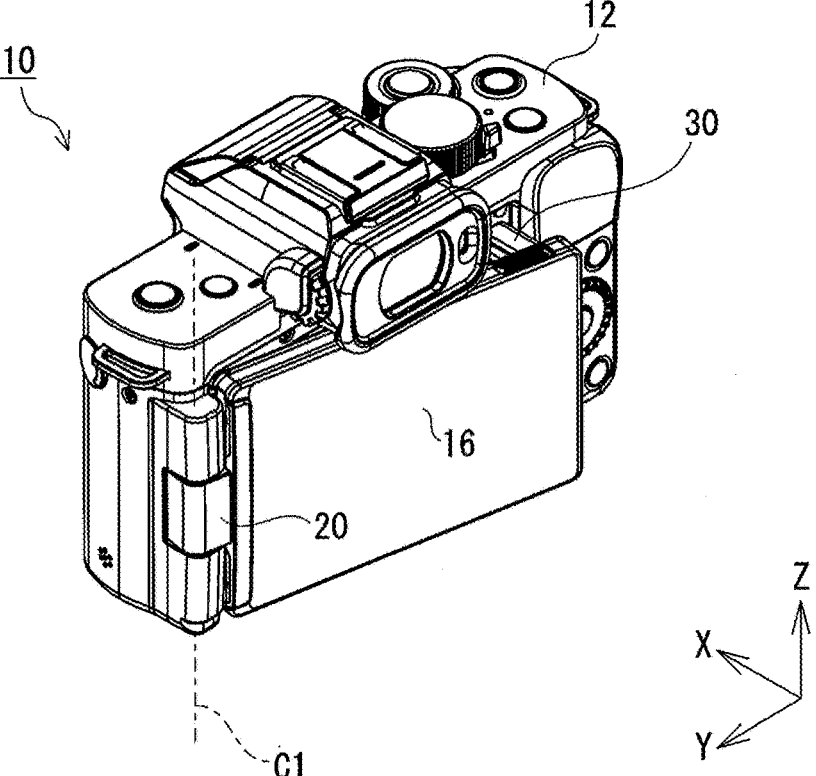
FIG. 17 is a rear perspective view of the image capturing device, with the monitor seated on the heat dissipation unit.

FIG. 16 is a partial cross-sectional view of the image capturing device, with the monitor seated on the heat dissipation unit; and FIG. 17 is a rear perspective view of the image capturing device, with the monitor seated on the heat dissipation unit.

As illustrated in FIG. 16, in the example according to this embodiment, the image capturing device 10 is configured in such a manner that, when the monitor 16 comes into contact with the heat dissipation unit 30 attached to the monitor seating surface 12a, the monitor 16 comes into contact with the heat sink cover 34 while avoiding the contact with the heat sink 32. In other words, the monitor 16 comes into contact with the heat sink cover 34 that is made of resin, without coming in contact with the plurality of fins 32a of the heat sink 32 made of metal.

Specifically, first of all, the monitor 16 becomes seated on the top surface 34f of the ring-like wall 34a of the heat sink cover 34 in the heat dissipation unit 30, as illustrated in FIG. 16. Secondly, the plurality of fins 32a of the heat sink 32 does not protrude beyond the top surface 34f of the ring-like wall 34a, in a view along the direction (Z-axis direction) in which the first rotational axis C1 of the monitor 16 extends. These features prevent the monitor 16 from coming into contact with the plurality of fins 32a of the heat sink 32 that is made of metal. In this manner, damage of at least one of the monitor 16 and the plurality of fins 32a, damage being due to coming contact with each other, is suppressed.

In the example according to this embodiment, as illustrated in FIG. 16, the top surface 34f of the ring-like wall 34a of the heat sink cover 34 included in heat dissipation unit 30 is inclined toward the first rotational axis C1, in a view along the direction in which the first rotational axis C1 of the monitor 16 extends (Z-axis direction). Specifically, the top surface 34f has an inclination at an angle allowing the monitor 16 to be seated on the entire top surface 34f. As a result, as illustrated in FIGS. 16 and 17, the monitor 16 is allowed to be seated on the monitor seating surface 12a, with the heat dissipation unit 30 therebetween. With this configuration, it is possible to suppress free rotations of the monitor 16. Furthermore, it is possible to keep the size of the image capturing device 10 compact, even with the heat dissipation unit 30 attached thereto, during transportation or storage, for example. Furthermore, while the monitor 16 is seated on the top surface 34f of the ring-like wall 34a of the heat sink cover 34, the plurality of fins 32a is covered by the monitor 16. In this manner, while it is not necessary to use the heat dissipation unit 30, it is possible to keep the plurality of fins 32a covered by the monitor 16. Therefore, it is possible to suppress a deterioration in the design of the image capturing device 10.

Furthermore, as illustrated in FIG. 16, in the example according to this embodiment, in order to achieve a high heat dissipation efficiency, each of the plurality of fins 32a protrudes as high as possible within the range not going beyond the top surface 34f of the ring-like wall 34a of the heat sink cover 34. In other words, in the fins 32a, the fins 32a further away from the first rotational axis C1 of the monitor 16 protrudes higher. Specifically, in a view along the direction in which the first rotational axis C1 extends (Z-axis direction), each of the plurality of fins 32a protrudes in such a manner that a constant distance is ensured with respect to the inclined top surface 34f.

In the example according to this embodiment, as illustrated in FIG. 16, even when the monitor 16 is seated on the top surface 34f of the ring-like wall 34a of the heat sink cover 34, and covers the plurality of fins 32a, the plurality of fins 32a of the heat dissipation unit 30 is allowed to dissipate heat at a high heat dissipation efficiency. Specifically, as illustrated in FIGS. 8 to 11, the plurality of fins 32a is allowed to dissipate heat to the outside of the heat sink cover 34 through the plurality of ventilation holes 34d provided to the ring-like wall 34a of the heat sink cover 34. Therefore, when there is no need to dissipate heat or there is a relatively low need of heat dissipation, a user can use the image capturing device 10 compactly, with the monitor 16 disposed at a position covering the plurality of fins 32a, as illustrated in FIGS. 16 and 17. Furthermore, when the need for heat dissipation is relatively high, the user can use the image capturing device 10 by positioning the monitor 16 away from the plurality of fins 32a, as illustrated in FIGS. 3 to 5. Because the monitor 16 is rotatable via the hinge 20, the heat dissipation unit 30 can be selectively used depending on the degree of need for heat dissipation.

According to the embodiment described above, it is possible to achieve a heat dissipation unit for an image capturing device, the heat dissipation unit being provided on an outer surface of a casing of the image capturing device, and configured to cool the image capturing device as required, without sacrificing other functions, such as capability for attaching a tripod to the casing. Specifically, in the example according to this embodiment, at least a part of the space between the monitor and the casing formed by rotating the monitor is effectively used as an installation space of the heat dissipation unit.

Although one embodiment of the present disclosure has been explained with reference to the embodiment above, embodiments of the present disclosure are not limited thereto.

For example, in the embodiment described above, the heat dissipation unit 30 is thermally connected to the processor 40 that is a heat source, via the heat transfer member 44. However, the embodiment of the present disclosure is not limited thereto. The heat dissipation unit may also be in direct contact with a heat source in the image capturing device.

Furthermore, in the example according to the embodiment described above, the heat dissipation unit 30 is provided detachably to the outer surface of the casing 12, that is, to the monitor seating surface 12a. However, the embodiment of the present disclosure is not limited thereto. For example, a recess may be provided on the monitor seating surface of the casing, and a plurality of fins of the heat dissipation unit may be provided permanently inside the recess. When there is a need for the heat dissipation of the heat dissipation unit, the monitor seated on the monitor seating surface and covering the plurality of fins is rotated to a position away from the plurality of fins via the hinge. When there is substantially no need for the heat dissipation by the heat dissipation unit, by contrast, the monitor is seated on the monitor seating surface to cover the plurality of fins.

Furthermore, in the example of the image capturing device 10 according to the embodiment described above, the heat generated from the heat source (processor 40) inside the casing 12 is released to the outside of the casing 12 via the heat dissipation unit 30. However, the image capturing device may include another means for dissipating heat, in addition to the heat dissipation unit. For example, as another means for dissipating heat, the image capturing device may include a fan that actively discharges high-temperature air inside the casing to the outside. By providing a fan in the image capturing device having the heat dissipation unit, the heat dissipation efficiency is improved. In addition, with the heat dissipation unit, the rotation speed of the fan can be kept low so that the level of noise generated from the fan can be suppressed to a lower level (as compared with a configuration not including the heat dissipation unit).

That is, in a broad sense, an image capturing device according to an embodiment of the present disclosure includes: a casing; a heat source provided inside the casing; a monitor; a hinge provided to the casing and rotatably supporting the monitor; and a heat dissipation unit including a plurality of fins provided on an outer surface of the casing and thermally connected to the heat source, in which the monitor is configured rotatable, by the hinge, between a first position at which the monitor covers the plurality of fins of the heat dissipation unit, and a second position at which the monitor is away from the plurality of fins.

As described above, the embodiments have been described as one example of the technology according to the present disclosure. The drawings and the detailed description have been provided for this purpose. Accordingly, the components described in the drawings and the detailed description may include not only the components essential for solving the problems, but also components that are not essential for solving the problems, in order to explain one example of the above technology. Therefore, it should not be immediately recognized that these non-essential components are essential, based on the fact that these non-essential components are illustrated in the drawings and described the detailed description.

In addition, the above-described embodiments are intended to illustrate the technology according to the present disclosure, and various changes, replacements, additions, omissions, and the like can be made within the scope of the claims or equivalents thereof.

The resent disclosure is applicable to an image capturing device having a rotatable monitor.

What is claimed is:

1. An image capturing device comprising:
a casing;
a heat source provided inside the casing;
a monitor;
a hinge provided to the casing and rotatably supporting the monitor; and
a heat dissipation unit that includes a plurality of fins provided on an outer surface of the casing and is thermally connected to the heat source,
wherein the monitor is configured rotatable, by the hinge, between a first position at which the monitor covers the plurality of fins of the heat dissipation unit, the covered plurality of fins otherwise being exposed, and a second position at which the monitor is away from the plurality of fins.

2. The image capturing device according to claim 1, wherein
the heat dissipation unit is attached detachably from the casing, the casing has a rear surface including a monitor seating surface on which the monitor is allowed to be seated while in a state where the heat dissipation unit is removed, and
the heat dissipation unit is detachable from at least a part of the monitor seating surface while in a state where the monitor is separated from the monitor seating surface.

3. The image capturing device according to claim 2, further comprising a heat transfer member provided inside the casing and in contact with the heat source,
wherein the monitor seating surface includes a through hole through which the heat transfer member is exposed to outside, and
the heat dissipation unit comes into contact with the heat transfer member through the through hole.

4. The image capturing device according to claim 2, further comprising a heat dissipation unit detection sensor that detects that the heat dissipation unit is attached to the casing.

5. The image capturing device according to claim 2, wherein
the heat dissipation unit includes a heat sink that has the plurality of fins, and a heat sink cover that partially covers the heat sink, and
the monitor is seated on the heat sink cover while avoiding contact with the heat sink.

6. The image capturing device according to claim 5, wherein
each of the plurality of fins protrudes in a first direction intersecting with the monitor seating surface,
the heat sink cover includes a wall surrounding the plurality of fins at least partially, in a view along the first direction, and
the plurality of fins protrudes in the first direction but not beyond a top surface of the wall of the heat sink cover.

7. The image capturing device according to claim 6, wherein the top surface of the wall of the heat sink cover is inclined toward a rotational axis of the monitor so as to allow the monitor to be seated on the entire top surface.

8. The image capturing device according to claim 7, wherein
the plurality of fins is arranged at intervals in a third direction orthogonal to the first direction and to a second direction that is a direction in which the rotational axis extends, and
in the plurality of fins, the fin further away from the rotational axis protrudes higher in the first direction.

9. The image capturing device according to claim 1, wherein the second position is a position at which a display unit of the monitor faces a front side of the casing.

10. A heat dissipation unit detachably attached to an image capturing device, wherein
the image capturing device includes:
a casing;
a heat source provided inside the casing;
a monitor; and
a hinge provided to the casing and rotatably supporting the monitor,
the casing includes a monitor seating surface allowing the monitor to be seated, and
the heat dissipation unit is detachably attached to the monitor seating surface, is thermally connected to the heat source, and includes an inclined surface allowing the monitor to be seated.

* * * * *